(12) United States Patent
Kawahara et al.

(10) Patent No.: US 10,513,125 B2
(45) Date of Patent: Dec. 24, 2019

(54) FLUID CONTAINING MEMBER

(71) Applicant: CANON KABUSHIKI KAISHA, Tokyo (JP)

(72) Inventors: Nobuto Kawahara, Utsunomiya (JP); Yutaka Mita, Utsunomiya (JP); Yoshimasa Araki, Utsunomiya (JP); Noriyasu Hasegawa, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/033,709

(22) Filed: Jul. 12, 2018

(65) Prior Publication Data
US 2019/0016145 A1 Jan. 17, 2019

(30) Foreign Application Priority Data

Jul. 14, 2017 (JP) .................................. 2017-138190
May 16, 2018 (JP) .................................. 2018-094398

(51) Int. Cl.
*B41J 2/175* (2006.01)
*B41J 2/14* (2006.01)
*G03F 7/00* (2006.01)

(52) U.S. Cl.
CPC ....... *B41J 2/17513* (2013.01); *B41J 2/14233* (2013.01); *B41J 2/175* (2013.01); *G03F 7/0002* (2013.01); *B41J 2002/14483* (2013.01); *B41J 2002/17516* (2013.01)

(58) Field of Classification Search
CPC .... B41J 2/17513; B41J 2/14233; B41J 2/175; B41J 2002/14483; B41J 2002/17516; G03F 7/0002

USPC .......................................................... 347/86
See application file for complete search history.

(56) References Cited

U.S. PATENT DOCUMENTS

| | | | |
|---|---|---|---|
| 9,649,847 B2 | 5/2017 | Nozawa | |
| 2006/0055749 A1* | 3/2006 | Schuster | B41J 2/17513 347/86 |
| 2007/0126814 A1* | 6/2007 | Hibbard | B41J 2/17513 347/85 |
| 2008/0037910 A1* | 2/2008 | Matsumoto | B41J 2/17513 383/120 |

(Continued)

FOREIGN PATENT DOCUMENTS

| | | |
|---|---|---|
| JP | 2012-171248 A | 9/2012 |
| JP | 2016-032103 A | 3/2016 |

(Continued)

*Primary Examiner* — Stephen D Meier
*Assistant Examiner* — Alexander D Shenderov
(74) *Attorney, Agent, or Firm* — Canon U.S.A., Inc. IP Division

(57) ABSTRACT

A fluid containing member includes a first containing chamber that contains a first fluid, and a second containing chamber that contains a second fluid. The first containing chamber and the second containing chamber are separated from each other by a first separation film on a side of the first containing chamber and a second separation film on a side of the second containing chamber. The first separation film and the second separation film are partly connected to each other or partly contact each other so as to move together in accordance with a change in an internal pressure of the first containing chamber or an internal pressure of the second containing chamber.

20 Claims, 10 Drawing Sheets

(56) References Cited

U.S. PATENT DOCUMENTS

2015/0097900 A1  4/2015  Araki
2016/0026084 A1  1/2016  Arai

FOREIGN PATENT DOCUMENTS

JP   2016-196129 A   11/2016
TW     201522088 A    6/2015

* cited by examiner

FLUID CONTAINING MEMBER

BACKGROUND OF THE INVENTION

Field of the Invention

One disclosed aspect of the embodiments relates to a fluid containing member that contains a fluid.

Description of the Related Art

As an ink jet printer and an imprint apparatus, those that include a fluid containing member that contains a fluid, such as ink or an imprint material, exist. Japanese Patent Laid-Open No. 2016-032103 describes a structure in which the inside of such a fluid containing member is divided into two containing sections or liquid chambers and one of the containing sections is used to adjust the pressure of the other containing section. The two containing sections are separated by a flexible film.

The fluid containing member that is described in Japanese Patent Laid-Open No. 2016-032103 is shown in FIG. 10. The fluid containing member that is described in Japanese Patent Laid-Open No. 2016-032103 includes a mechanism that detects breakage of a separation film 1. On a side of a second containing chamber 6, a liquid that does not easily mix with a liquid that fills a first containing chamber 5 that communicates with a discharge head 14, or a liquid having a specific gravity that is less than that of the liquid that fills the first containing chamber 5 is used. Therefore, when the separation film 1 breaks, liquid that has leaked out to the side of the second containing chamber 6 from the first containing chamber 5 stagnates at a measurement region 52 that is situated below the second containing chamber 6. A sensor 53 is provided near the measurement region 52, and is used as a detecting unit that is capable of detecting physical properties, such as the refractive index, of a liquid. In Japanese Patent Laid-Open No. 2016-032103, by detecting changes in the physical properties of the liquid that has stagnated at the measurement region by using the sensor 53, it is possible to detect breakage in the separation film 1.

According to a method that is described in Japanese Patent Laid-Open No. 2016-032103, it is possible to detect breakage in a separation film. However, when the internal pressure of the first containing chamber and the internal pressure of the second containing chamber are equal to each other, although a liquid (a fluid) that fills the first containing chamber and a liquid (a fluid) that fills the second containing chamber contact each other, it takes time for each liquid to flow out to the containing chamber on the opposite side, as a result of which the detection may be delayed. Depending upon the combination of fluids, either one of the fluid in the first containing chamber and the fluid in the second containing chamber may deteriorate even if the fluids only contact each other. Therefore, it is required that the first fluid and the second fluid avoid contacting each other as much as possible in the first place, and do not mix with each other.

SUMMARY OF THE INVENTION

One aspect of the embodiments provides a fluid containing member including a first containing chamber that contains a first fluid, and a second containing chamber that contains a second fluid. The first containing chamber and the second containing chamber are separated from each other by a first separation film on a side of the first containing chamber and a second separation film on a side of the second containing chamber. The first separation film and the second separation film are partly connected to each other or partly contact each other so as to move together in accordance with a change in an internal pressure of the first containing chamber or an internal pressure of the second containing chamber.

Further features of the disclosure will become apparent from the following description of exemplary embodiments with reference to the attached drawings.

DESCRIPTION OF THE EMBODIMENTS

The disclosure provides a fluid containing member that suppresses mixture of fluids contained in two containing chambers caused by breakage of a separation film between the two containing chambers.

An embodiment for carrying out the present disclosure is described below.

Figure 1:
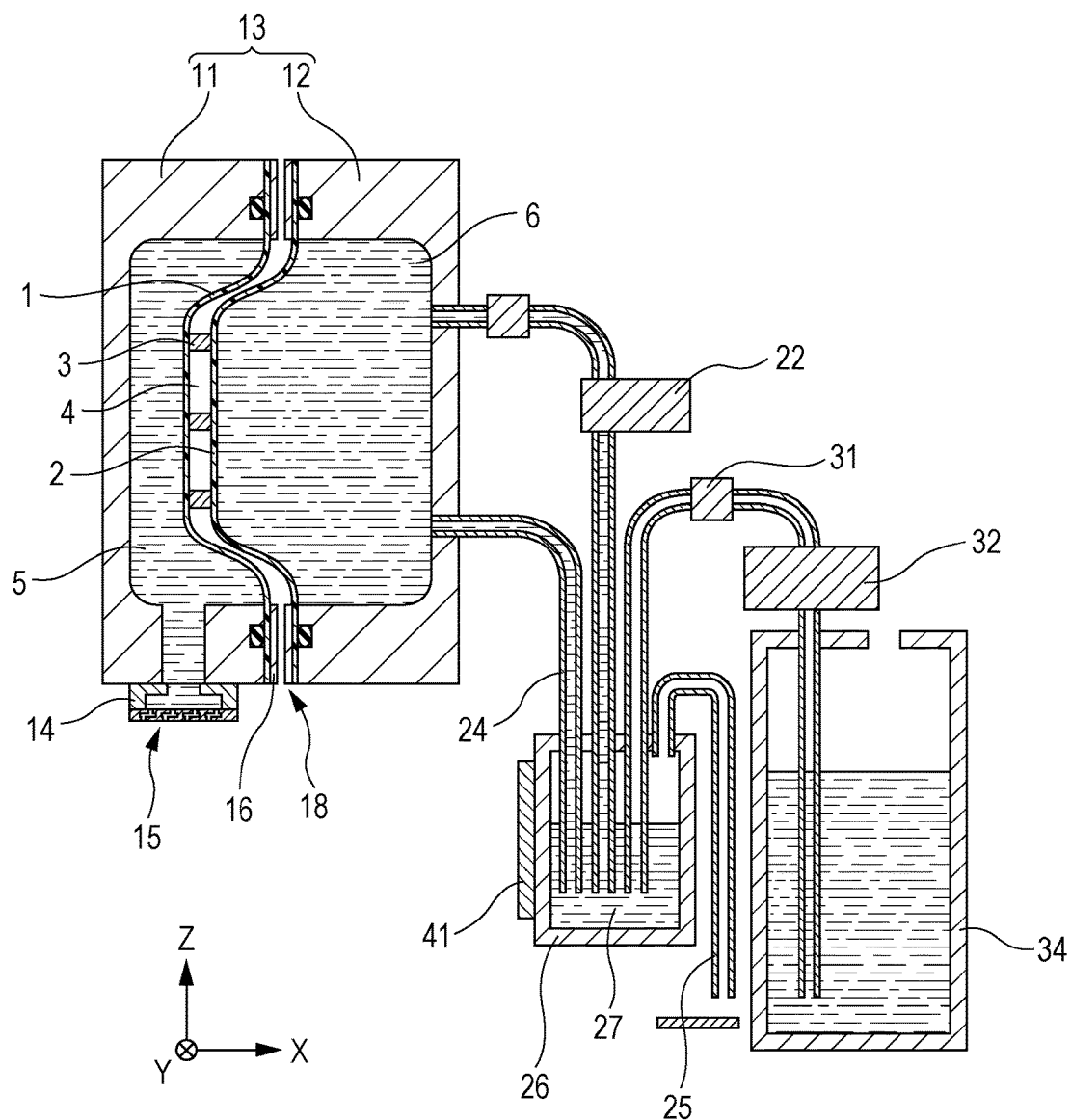
FIG. 1 shows a fluid containing member.

FIG. 1 shows an exemplary fluid containing member. A fluid containing member 13 includes a casing 11 and a casing 12, and is a cartridge-type containing member that includes a discharge head 14. The discharge head 14 has discharge openings 15, and is capable of discharging a fluid that is contained in the fluid containing member from the discharge openings 15. The discharge head 14 need not be provided at the fluid containing member 13. For example, the discharge head 14 may be disposed apart from and connected to the fluid containing member 13 via, for example, a communication pipe.

Figure 2:
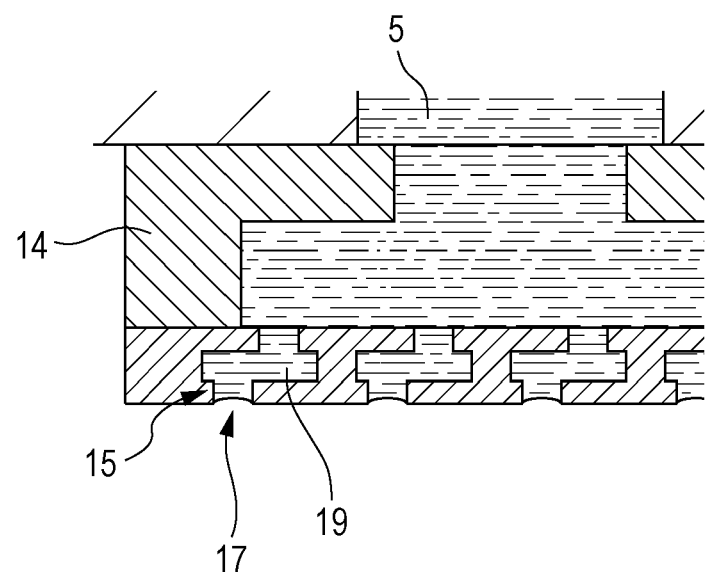
FIG. 2 shows a discharge head.

An enlarged view of the discharge head 14 is shown in FIG. 2. The discharge openings 15 are holes that are formed in a surface of the discharge head 14 with a density of approximately 500 to 1000 holes per inch. A meniscus 17 of a fluid surface is formed at each discharge opening 15. The discharge openings 15 communicate with corresponding pressure chambers 19. Energy generating elements (not shown) for generating energy for discharging the fluid are provided in the corresponding pressure chambers 19. Piezoelectric elements or heating elements may be used as the energy generating elements. When piezoelectric elements are used, by driving and controlling the piezoelectric elements in the pressure chambers 19 of the corresponding discharge openings 15, the inner volumes of the pressure chambers 19 are changed to discharge the fluids in the pressure chambers to the outside. The piezoelectric elements may be manufactured by using, for example, an MEMS (Micro Electro Mechanical System) technology. The discharge head is not provided with a control valve between the pressure chambers 19 and a first containing chamber 5 that contains the fluid that is discharged from the discharge head 14. Therefore, by controlling the internal pressure of the first containing chamber 5 to a pressure that is negative with respect to outside pressure (atmospheric pressure) by, for example, approximately 0.3 to 0.5 kPa, the fluid forms a meniscus 17 at an open face of each discharge opening 15 to suppress dripping of the fluid at an undesired timing.

Referring again to FIG. 1, a structure of the fluid containing member is described. The fluid containing member includes the first containing chamber 5 that contains a first fluid and a second containing chamber 6 that contains a second fluid. In the present structure, the first containing chamber 5 is formed in the casing 11 by closing an opening of a recessed portion of the casing 11 by a first separation film 1 (The first containing chamber 5 comprises a recessed portion of a casing closed by the first separation film 1, and the second containing chamber 6 comprises a recessed portion of a casing closed by the second separation film 2). The second containing chamber 6 in the casing 12 is formed by closing an opening of a recessed portion of the casing 12 by a second separation film 2. By combining the casing 11 and the casing 12, the first separation film 1 and the second separation film 2 that separate the first containing chamber 5 and the second containing chamber 6 are provided between the first containing chamber 5 and the second containing chamber 6. That is, the first containing chamber 5 and the second containing chamber 6 are separated by the first separation film 1 on a side of the first containing chamber 5 and the second separation film 2 on a side of the second containing chamber 6. In other words, the first separation film 1 is part of the first containing chamber 5 that is in direct contact with the first fluid. As will be explained later, the first separation film 1 may move in either direction, causing the volume of the first containing chamber 5 to expand or contract, which in turns cause a change in the internal pressure of the first containing chamber 5. Similarly, the second separation film 2 is part of the second containing chamber 6 that is in direct contact with the second fluid. As will be explained later, the second separation film 2 may move in either direction together with the first separation film 1, causing the volume of the second containing chamber 6 to expand or contract, which in turns cause a change in the internal pressure of the second containing chamber 6. As will be described later, in one embodiment, the first separation film 1 and the second separation film 2 may be separated by a gap or space 4 and may be connected by bridges 3.

The first containing chamber 5 communicates with the discharge head 14, and communicates with external space via the discharge head 14. The second containing chamber 6 is connected to a sub tank by a connection pipe 24.

The first separation film 1 and the second separation film 2 are partly connected to each other or partly contact each other. First, an example in which the first separation film 1 and the second separation film 2 are partly connected to each other is described. In FIG. 1, the first separation film 1 and the second separation film 2 are partly connected to each other by bridges 3.

In the embodiment, the first containing chamber 5 and the second containing chamber 6 are separated by two separation films, that is, the first separation film 1 and the second separation film 2. Therefore, even if one of the separation films breaks, as long as the other separation film remains, it is possible to suppress mixture of the first fluid that is contained in the first containing chamber 5 and the second fluid that is contained in the second containing chamber 6.

Next, a relationship between the internal pressures of the first containing chamber 5 and the second containing chamber 6 (the pressures of the first and second fluids) and changes in the shapes of the corresponding containing chambers is described. When the internal pressure of the first containing chamber 5 and the internal pressure of the second containing chamber 6 are equal to each other, the shape of each containing chamber is maintained. In contrast, when a difference occurs between the internal pressure of the first containing chamber 5 and the internal pressure of the second containing chamber 6, the first separation film 1 and the second separation film 2 move together (move at the same time and in the same direction) to a side of lower internal pressure. When the difference between the internal pressures becomes zero, the movement stops. This cycle (the movement and the stoppage) is repeated. Therefore, the internal pressure of the first containing chamber 5 and the internal pressure of the second containing chamber 6 can be kept equal to each other. More specifically, since the volume of the inside of the first containing chamber 5 is reduced as the first fluid is discharged from the discharge head 14, the internal pressure is correspondingly reduced. At this time, since the volume of the inside of the second containing chamber 6 is not changed, the internal pressure of the second containing chamber 6 becomes relatively higher than the internal pressure of the first containing chamber 5. Here, the first separation film 1 and the second separation film 2 are partly connected to each other. Therefore, in the fluid containing member 13, the first separation film 1 and the second separation film 2 move together towards the side of the first containing chamber 5 by an amount corresponding to the volume of the first fluid that has been discharged. At the same time, the second fluid is sucked up into the second containing chamber 6 from the sub tank 26 via the connection pipe 24 as a result of the movement of second separation film 2. This causes the internal pressure of the first containing chamber 5 and the internal pressure of the second containing chamber 6 to be equal to each other again, and to be in an equilibrated state. In this way, the internal pressure of the first containing chamber 5 is adjusted by the second fluid that is contained in the second containing chamber 6. That is, when the internal pressure of either one of the first containing chamber 5 and the second containing chamber 6 changes, the first separation film 1 and the second separation film 2 move together in accordance with the change in the internal pressure. In order to allow the first separation film 1 and the second separation film 2 to move together, the first separation film 1 and the second separation film 2 are partly connected to each other by bridges 3.

The first separation film 1 and the second separation film 2 are each a flexible film. It is desirable that first separation film 1 be formed of a material that is resistant to the first fluid with which it contacts and the second separation film 2 be formed of a material that is resistant to the second fluid with which it contacts. The first separation film 1 and the second separation film 2 may each be formed of a fluororesin, such as PTFE (Poly Tetra Fluoro Ethylene). However, since there are many fluororesins that have high hardness, it is technically difficult to form them thin. Since the first separation film 1 contacts the first fluid that is discharged from the discharge head 14, the first separation film 1 is formed of a fluororesin, such as PTFE. On the other hand, the second separation film 2 basically does not contact the first fluid. Therefore, examples of the material of the second separation film 2 include PE (polyethylene), PVC (polyvinyl chloride), PET (polyethylene terephthalate), PVAL (polyvinyl alcohol), and PVDC (polyvinylidene chloride). Other examples are polyamide synthetic resins, such as nylon. In this way, the first separation film 1 and the second separation film 2 may be formed of different materials in accordance with desired characteristics thereof.

Figure 3:
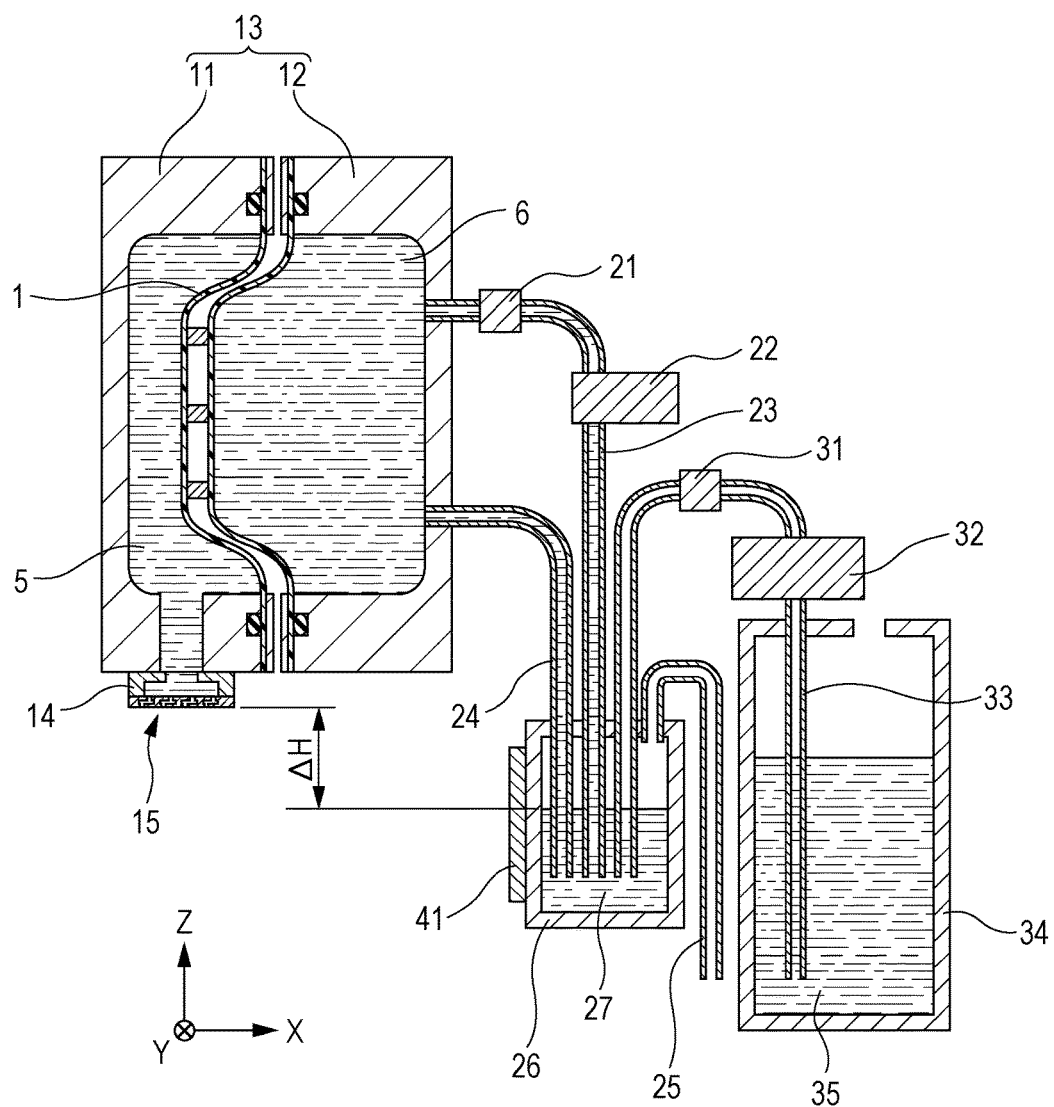
FIG. 3 shows the fluid containing member.

As shown in FIG. 1, the second containing chamber 6 is connected to the sub tank 26 via the connection pipe 24. Since the sub tank 26 contains a second fluid 27, the interface (the liquid surface) of the second fluid 27 is positioned below the discharge openings 15 of the discharge head 14 in a gravitational direction. FIG. 3 shows this state. The liquid surface of the second fluid 27 is positioned below the discharge openings 15 by ΔH. Here, each discharge opening 15 of the discharge head 14 is circular having a diameter of 10 μm, and a case in which one drop of ink having a density that is substantially equal to that of water is discharged at 1 pL is assumed. In this case, in order to maintain the state of each meniscus 17 shown in FIG. 2, it is desirable that the internal pressure of the first containing chamber 5 be controlled to a pressure that is lower than the outside pressure by 0.40±0.04 kPa. Therefore, it is desirable that ΔH be 41±4 mm. A liquid surface sensor 41 is disposed on a side surface of the sub tank 26. When the liquid surface exceeds a range of ±4 mm with respect to the height of the liquid surface (height below the discharge openings 15 by 41 mm), serving as a reference, a correction operation is started. That is, a liquid supplying pump 32 and a control valve 31 are driven to supply the second fluid from a main tank 34 towards the sub tank 26, or to return the second fluid from the sub tank 26 towards the main tank 34. This controls the liquid surface in a desired region. That is, the pressure of the first fluid is adjusted by the second fluid. The pressure of the second fluid is adjusted by pressure adjusting units, such as the liquid supplying pump 32, the sub tank 26, and the main tank 34, which communicate with the second containing chamber 6.

The first containing chamber 5 and the second containing chamber 6 are separated by the first separation film 1 and the second separation film 2. When the first separation film 1 and the second separation film 2 individually move and deform, even if the height of the liquid surface in the sub tank 26 is adjusted, it is difficult to control the pressure in the discharge head 14. For example, even if an attempt is made to control the liquid surface in the sub tank 26 so as to be below the discharge openings 15, only the second separation film 2 continues to move in an X direction in FIG. 1 until the internal pressure of the second containing chamber 6 becomes equal to the outside pressure. In addition, the second fluid overflows from an inlet 25 of the sub tank 26, or the second fluid is supplied to the main tank 34 by an amount corresponding to the amount of second fluid that has been returned due to a liquid adjustment function of the sub tank 26. In either case, the second containing chamber 6 finally runs out of the second fluid, and the second separation film 2 gets stuck on a wall surface of the casing 12. Therefore, the second separation film 2 gets stuck flat on the wall surface of the casing, and the shape of the second separation film 2 is changed to fit the wall surface of the casing. At this time, since the first separation film 1 does not move together with the second separation film 2, the pressure in the discharge head 14 does not change in response to the height of the liquid surface in the sub tank 26.

In contrast, in the embodiment, the first separation film 1 and the second separation film 2 are partly connected to each other. In FIG. 1, the first separation film 1 and the second separation film 2 are connected to each other by the plurality of bridges 3. Therefore, the first separation film 1 and the second separation film 2 move together, and the internal pressure of the first containing chamber 5 and the internal pressure of the second containing chamber 6 are kept equal to each other. This causes the internal pressures of the containing chambers to be equal to each other by the negative pressure generated by the meniscus 17 at each discharge opening 15.

Figure 4A:
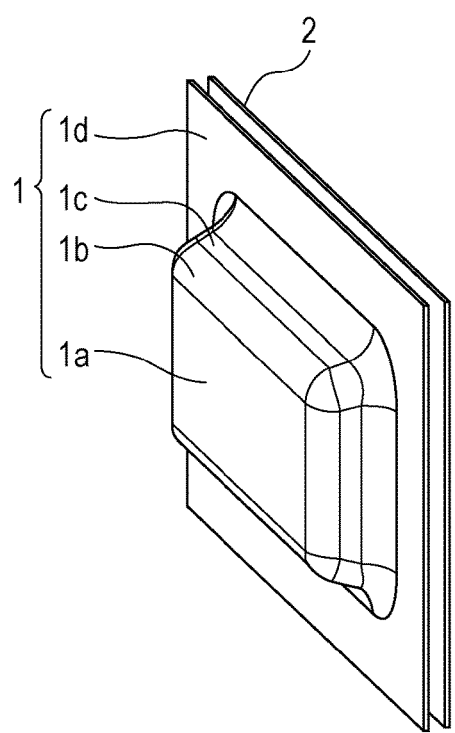
FIGS. 4A and 4B show separation films.
Figure 4B:
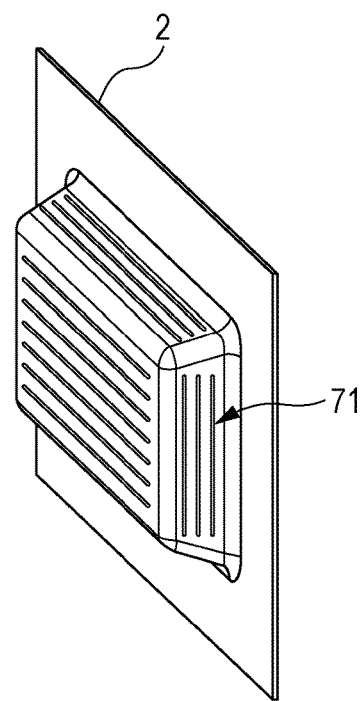

FIGS. 4A and 4B show the details of the shape of the first separation film 1 and the shape of the second separation film 2. The first separation film 1 and the second separation film 2 are formed by molding a flexible film into protruding shapes so as to match the shapes of the recessed portions of the casings. As shown in FIG. 4A, the first separation film 1 and the second separation film 2 are superimposed upon each other to irradiate them with laser by using a laser processor in accordance with welding lines 71 shown in FIG. 4B, and to thermally weld the irradiated portions. The thermally welded portions become the bridges 3. As shown in FIG. 1, a portion between the first separation film 1 and the second separation film 2 is formed so as to be connected to outside air by a vent hole 18. Here, the first containing chamber 5 and the second containing chamber 6 are kept in a negative pressure state equal to outside pressure, so that portions of the two separation films that are not welded are in an expanded state with respect to the containing chambers, and a space 4 is formed.

It is desirable that, with a reduction in the amount of the first fluid, the first separation film 1 and the second separation film 2 move smoothly. The first separation film 1 shown in FIG. 4A includes a ceiling portion 1a that is a protruding ceiling and that is a flat surface, a side surface portion 1c that is positioned at a side surface and that is inclined with respect to the ceiling portion 1a, and an R portion 1b that has an R shape and that is disposed between the ceiling portion 1a and the side surface portion 1c. The second separation film 2 has a shape in accordance with the shape of the first separation film 1, so the protruding portion of the second separation film 2 fits inside the recess side of the protruding portion of the first separation film 1. An R shape here refers to a curve line with at least two curve segments that have different curvatures and are connected at an inflexion point, similar to the curve line in the letter "R." In such separation films, it is desirable that the arrangement density of the bridges 3 per unit area be higher at the ceiling portion than at the side surface portion 1c and the R portion 1b. In addition, it is desirable that the arrangement density of the bridges 3 per unit area at the R portion 1b be the lowest. This is because, when there are too many bridges 3 at the R portion 1b and the side surface portion 1c, the rigidity is increased, as a result of which the separation films have difficulty moving smoothly. Here, the welding lines 71 are disposed for the bridges. However, it is desirable that the number of welding lines 71 be such that the number of welding lines 71 at the R portion 1b<the number of welding lines 71 at the side surface portion 1c<the number of welding lines 71 at the ceiling portion 1a.

It is desirable that, when the first separation film 1 or the second separation film 2 breaks, the dropping of the fluid that is contained in the containing chamber from a cartridge be suppressed. Therefore, it is desirable that, in the orientation of the fluid containing member that is being used, the welding lines 71 (the bridges 3) be formed so as to extend along a Y axis direction (in a direction orthogonal to the gravitational direction). It is desirable that the welding lines 71 (the bridges 3) have a lattice form. The orientation of the fluid containing member that is being used refers to the orientation thereof when, for example, the fluid containing member is mounted on a recording apparatus, such as an ink jet printer or an imprint apparatus.

The following method is an example of a method of incorporating the first separation film 1 and the second separation film 2. First, the first separation film 1 and the second separation film 2 are molded with protruding shapes extending along an inner wall surface of the casing 11. Next, in incorporating them in the fluid containing member 13, they are temporarily deformed so as to protrude in an opposite direction along an inner wall surface of the casing 12. Thereafter, the first separation film 1 and the second separation film 2 are interposed between the casing 11 and the casing 12. Spacers may be interposed between the first separation film 1 and the second separation film 2 such that the first separation film 1 and the second separation film 2 do not contact each other except at the bridges. The spacers may be at least integrally molded with at least one of the separation films.

The casing 11 and the casing 12 may be formed with symmetrical shapes with respect to a plane with a mounting portion of the first separation film 1 or the second separation film 2 being a boundary. For example, the protruding shape of the first separation film 1 and the protruding shape of the second separation film 2 may be formed so as to protrude in opposite directions. By this, when the first fluid is being consumed, the first fluid in the first containing chamber 5 can be sufficiently consumed until the first separation film 1 and the second separation film 2 are deformed along the inner wall surface of the casing 11.

In order to smoothly move the first separation film 1 and the second separation film 2, it is desirable that spot welding (such as dot welding) be performed on the side surface portion. It is desirable that line welding be performed in a direction orthogonal to the movement direction of the first separation film 1 and the second separation film 2. That is, it is desirable to form the bridges 3 with the shape of a spot (such as a dot) or a line. When the shape is a line, the first separation film 1 and the second separation film 2 are connected to each other by a linear bridge.

The structure in which the first separation film 1 and the second separation film 2 are partly connected to each other by the bridges 3 shown in FIG. 1 is described above. However, in the embodiment, the first separation film 1 and the second separation film 2 may partly contact each other. That is, the bridges 3 need not be portions that protrude from the surface of the first separation film 1 and the surface of the second separation film 2. For example, portions of the first separation film 1 and the second separation film 2 that are partly fused and only contact each other may also be the bridges 3.

In FIG. 4, for example, by using PTFE films as the first separation film 1 and the second separation film 2, irradiating them with laser in accordance with the welding lines 71, and thermally welding them, the first separation film 1 and the second separation film 2 are partly connected to each other (or partly contact each other). Laser welding is a technique that is frequently used when joining two components of the same material together. On the other hand, the fluid containing member of the embodiment may contain a photosensitive resist as the first fluid. When the photosensitive resist is, in particular, an imprint material, it is necessary to minimize contamination by metal ions. Therefore, the separation films are, for example, PTFE films. However, considering the ease with which laser welding can be performed, one of the components needs to transmit a laser beam therethrough. Therefore, it is desirable that a transparent PTFE film be used for the first separation film 1. On the other hand, it is desirable that the interface to be welded be an opaque surface that allows heat to be easily generated by the laser irradiation. Therefore, it is desirable that an opaque PTFE film be used for the second separation film 2. When the second separation film 2 is a PTFE film, since it is difficult to perform coating on a surface thereof, by adding carbon powder to the material and reducing the transmittance, it is possible to realize an opaque surface. Since the first separation film 1 is a separation film that directly contacts the photosensitive resist, the material of the first separation film 1 needs to be a material having a small amount of additives. Therefore, it is desirable that the first separation film 1 not contain an additive. On the other hand, when formed from a thin-film resin member, static electricity tends to be generated, as a result of which carbon is added to the second separation film 2 and is connected to ground, to allow electric charge to escape.

Figure 5A:
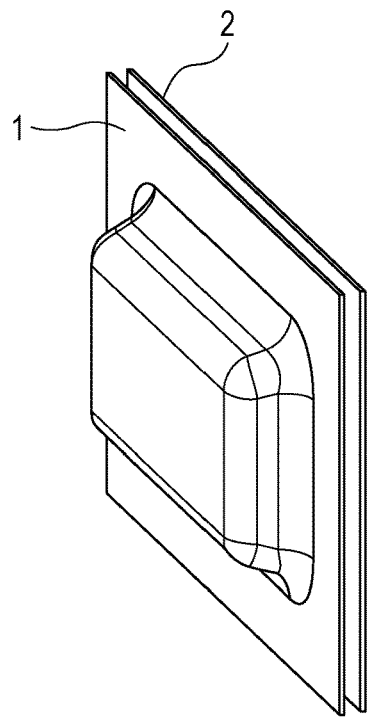
FIGS. 5A to 5C show the separation films.
Figure 5B:
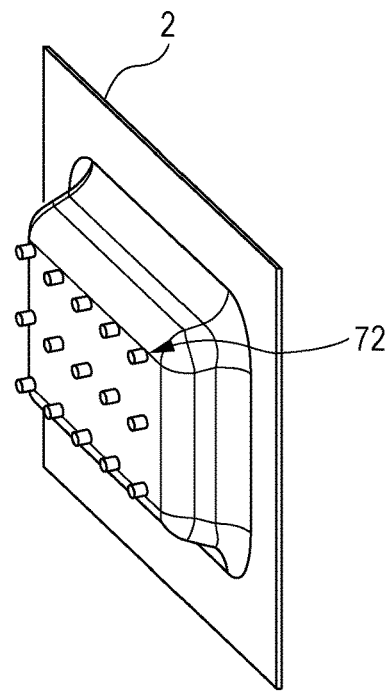
Figure 5C:
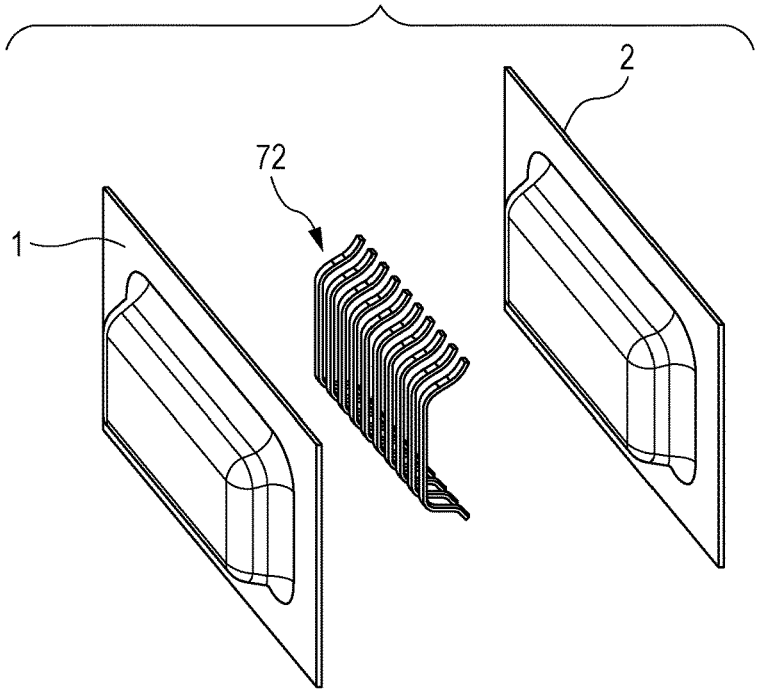

FIGS. 4A and 4B illustrate an example in which the first separation film 1 and the second separation film 2 are thermally welded by using laser, and the welded portions become bridges 3, that is, portions where the first separation film 1 and the second separation film 2 contact each other (or where they are connected to each other) is described. The first separation film 1 and the second separation film 2 may be made to partly contact each other (or to be partly connected to each other) by other methods. Examples thereof are the connection shown in FIGS. 5A to 5C. As shown in FIG. 5A, that the first separation film 1 and the second separation film 2 are molded with protruding shapes and that they are superimposed upon each other in parallel are the same as in FIGS. 4A and 4B. However, as shown in FIG. 5B, the surface of the second separation film 2 is provided with protruding portions 72. The protruding portions 72 may formed so as to partly protrude by molding and processing the second separation film 2, or may be formed by forming a different protruding member (such as PTFE). By welding or fusing the protruding portions 72 with respect to the first separation film 1 to secure and connect them, the bridges 3 are formed. Alternatively, as shown in FIG. 5C, by disposing protruding portions 72, such as linear protruding portions, as different members between the first separation film 1 and the second separation film 2, and welding or fusing them to secure and contact (connect) them, the bridges 3 can also be formed (The protruding portions 72 become the bridges 3 when they are welded together with the first separation film 1 and the second separation film 2). When the protruding portions 72 are formed by molding the second separation film 2, the first separation film 1 and the second separation film 2 contact each other. When the protruding portions 72 are formed separately from the first separation film 1 and the second separation film 2, the first separation film 1 and the second separation film 2 are connected to each other.

As an example of the bridges 3, a so-called double-sided tape having adhesive layers on both sides of a supporting member may be used. In order for the double-sided tape to sustain each of the separation films even when the first separation film 1 or the second separation film breaks and a fluid leaks therefrom, it is desirable that the first separation film 1 and the second separation film 2 be formed of a material that is resistant to the first fluid and a material that is resistant to the second fluid, respectively. When the fluid containing member is to be used as, for example, a cartridge of an imprint apparatus, it is desirable that the material that allows little degassing into the imprint apparatus be used. From these viewpoints, it is desirable that the adhesive layers be formed of acrylic resin.

Figure 6A:
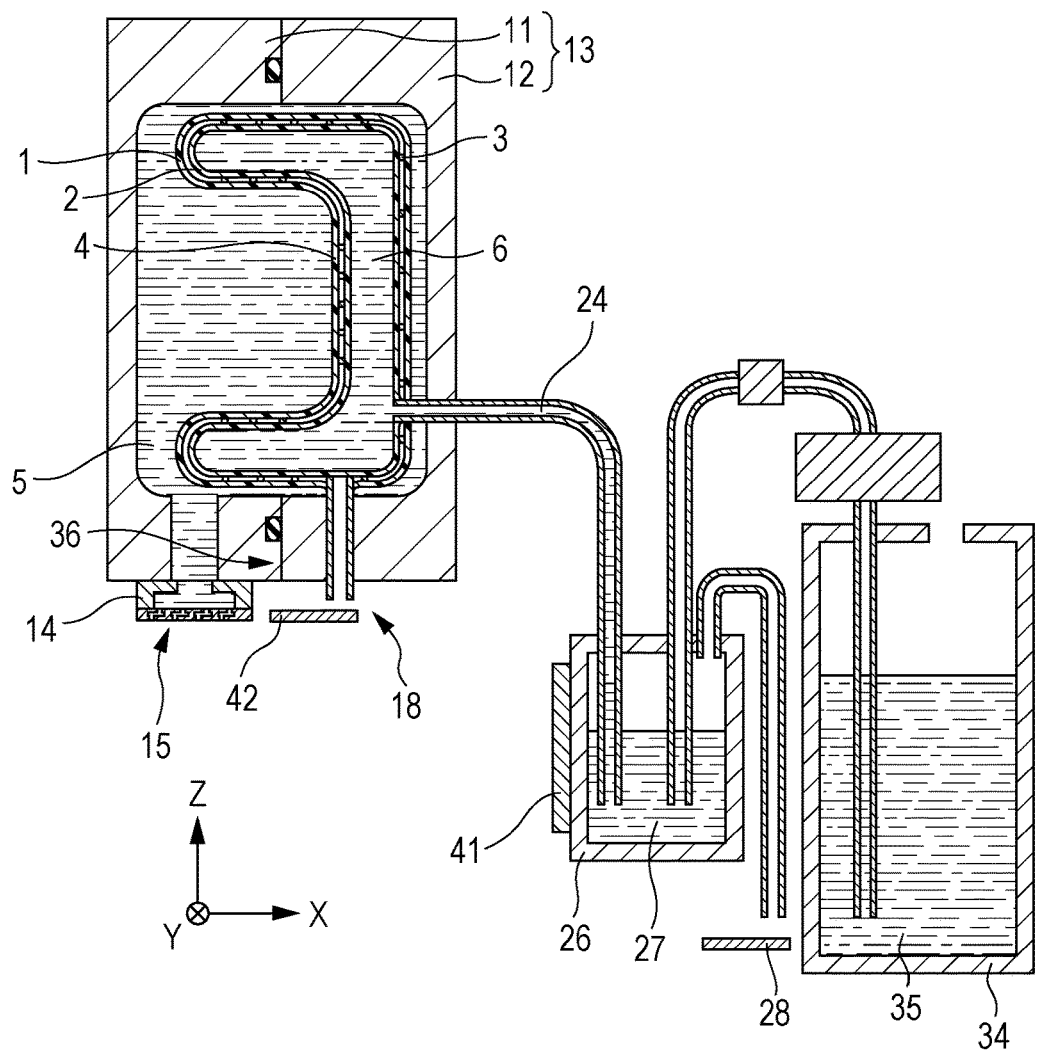
FIGS. 6A and 6B show a fluid containing member.
Figure 6B:
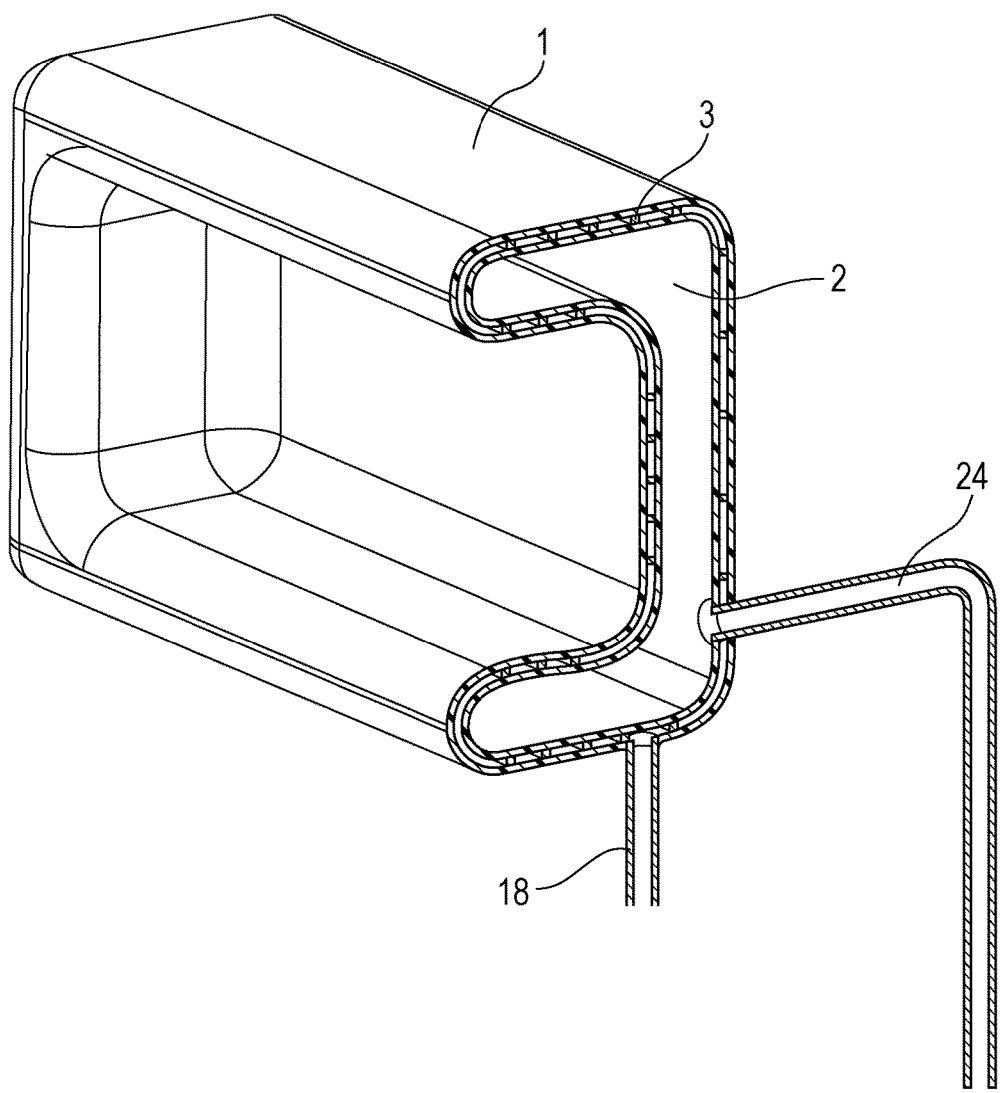

The first separation film 1 and the second separation film 2 need not have protruding shapes that protrude from the center thereof. FIG. 6A shows a fluid containing member 13 in which a first separation film 1 and a second separation film 2 are closed in the form of a bag. FIG. 6B is an enlarged view thereof, and shows a connection pipe 24 protruding to the outside in the form of a straw from the inside of the bag-like second separation film 2. Similarly to the form shown in FIG. 1, the connection pipe 24 extends through the casings of the fluid containing member 13 and reaches a sub tank 26, and a second fluid is contained in the bag-like second separation film 2. The bag-like separation film 1 is disposed on the outer side of the second separation film 2 so as to envelope the second separation film 2. The first separation film 1 and the second separation film 2 partly contact each other (are partly connected to each other) by bridges 3. From a space 4 between the first separation film 1 and the second separation film 2, a vent hole 18 extends through the first separation film 1 and protrudes therefrom. The vent hole 18 extends through the casing of the fluid containing member 13 and is connected to the outside.

In the form shown in FIG. 1, the casing 11 and the casing 12 function as an outside partition of the containing chamber that contains a first fluid and an outside partition of the containing chamber that contains the second fluid, respectively. However, in the form shown in FIG. 6, the bag that contains the second fluid floats in the first fluid. The other points do not differ from those described in, for example, FIG. 1. Even in the form shown in FIG. 6, it is possible to realize the effects of the embodiment.

It is desirable that the thickness of the first separation film 1 and the thickness of the second separation film 2 be greater than or equal to 10 µm and less than or equal to 100 µm. The thickness of the first separation film 1 and the thickness of the second separation film 2 may differ from each other. When the thickness of the first separation film 1 and the thickness of the second separation film 2 differ from each other, the rigidity of the separation films as a whole is reduced, so that it is possible to move the first separation film 1 and the second separation film 2 smoothly as the amount of first fluid is reduced due to the discharge thereof. Considering that the first separation film 1 contacts the first fluid, it is desirable that the first separation film 1 be thicker than the second separation film 2. For example, it is desirable that the thickness of the first separation film 1 be greater than or equal to 1.3 times and less than or equal to 2.5 times the thickness of the second separation film 2. However, for example, when the internal pressure of the first containing chamber 5 is to be kept to an internal pressure that is lower than the outside pressure by 0.4±0.04 kPa, it is desirable that the first separation film 1 and the second separation film 2 deform and move freely without resistance with a pressure difference of 0.01 kPa or less. Here, it is assumed that the thickness of the first separation film 1 and the thickness of the second separation film 2 be substantially a uniform thickness in their corresponding separation films (at least the thickness of a ceiling portion 1a, the thickness of an R portion 1b, and the thickness of a side surface portion 1c are substantially uniform).

Figure 7:
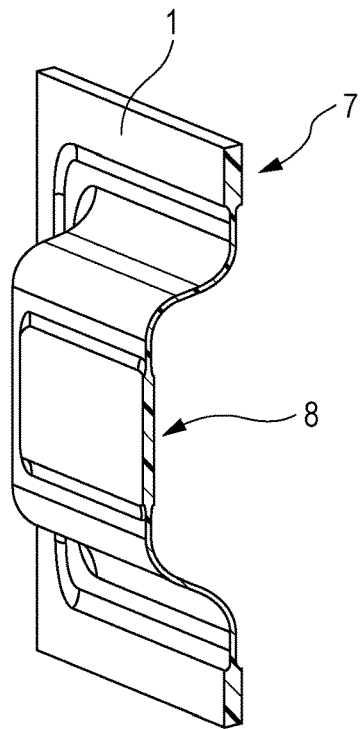
FIG. 7 shows a separation film.

On the other hand, it is possible for the separation film thickness in one separation film to differ. For example, FIG. 7 shows a structure of the first separation film 1. As shown in FIG. 7, it is desirable that an outer edge portion 7 of the first separation film 1 be thicker than a ceiling portion 8 of the first separation film 1. This makes it possible to suppress breakage of the separation film when welding or adhering the separation film. When the thickness of the ceiling portion 8 is greater than the thickness of the R portion and the thickness of the side surface portion, it is possible to smoothly move the separation film.

Examples of a method of molding the ceiling portion 8 include vacuum molding while heating, blow molding while heating, and molding using a mold while heating. In molding using a mold, a method of fixing the outer edge portion 1d of a separation film in a planar state to a fixing frame and heating it, and pushing out the protruding portion (the ceiling portion 1a, the R portion 1b, and the side surface portion 1c) shown in FIG. 4A by using the mold is available. However, the method is not limited to such vacuum molding and molding using a mold, so that a molding method suitable for the material of a flexible member that becomes the separation film and for a required shape thereof can be selected.

As separation films, separation films other than the first separation film 1 and the second separation film 2 may be used. For example, three separation films may be used. Even in such a structure, by partly connecting the separation films or partly contacting the separation films to each other, it is possible to move the separation films together and provide the effects of the embodiment.

The separation films may break, for example, when the separation films are being manufactured or a hole is formed during movement of the separation films. When the first fluid and the second fluid are mixed, problems occur in that the first fluid gets stuck in the discharge head, and in that even if the first fluid is discharged from the discharge head, a good image or pattern cannot be formed. In contrast, in the embodiment, as described above, even if one of the first separation film 1 and the second separation film 2 breaks, as long as the other of the first separation film 1 and the second separation film 2 is not broken, it is possible to suppress the mixture of the first fluid and the second fluid.

Figure 8:
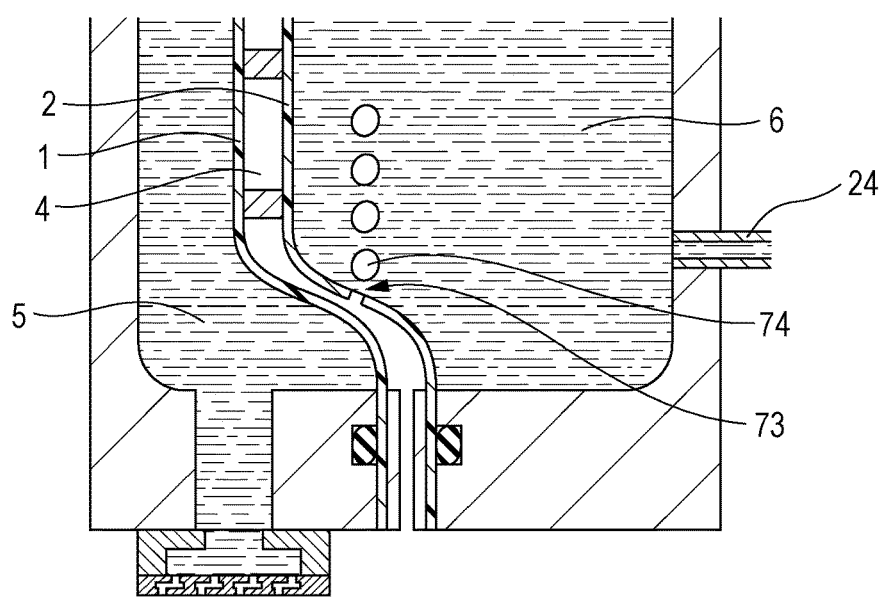
FIG. 8 shows a state in which a hole is formed in a separation film of the fluid containing member.

FIG. 8 shows a state in which the second separation film 2 is broken and a hole 73 is formed in the second separation film 2. Since the space 4, which is a gap between the first separation film 1 and the second separation film 2, communicates with outside air, the pressure in the space 4 is equal to atmospheric pressure. On the other hand, as illustrated in FIG. 3, the pressure of the first containing chamber 5 and the pressure of the second containing chamber 6 are each adjusted to a negative pressure with respect to the atmospheric pressure by, for example, 0.4 kPa. By this, from the space 4 where the pressure is relatively high towards the second containing chamber 6 where the pressure is relatively low, air from the hole 73 is converted into air bubbles 74 and the air bubbles 74 are sucked in. Since the pressure of the air bubbles 74 is equal to the atmospheric pressure, the internal pressure of the second containing chamber 6 rises, and the second fluid is pushed out towards the sub tank 26 via the connection pipe 24. In this way, even if the hole 73 is formed in the second separation film 2, it is possible to prevent the first fluid contained in the first containing chamber 5 and the second fluid contained in the second containing chamber 6 from contacting each other.

On the other hand, when a hole is formed in the first separation film 1, air bubbles are sucked into the first containing chamber 5 and the internal pressure of the first containing chamber 5 rises. As a result, the first separation film 1 and the second separation film 2 move towards a side of the second containing chamber 6, so that an amount of the second fluid having a volume that is equal to the volume of the second fluid that has moved is pushed out towards the sub tank 26 via the connection pipe 24. In addition, it is possible to prevent the first fluid contained in the first containing chamber 5 and the second fluid contained in the second containing chamber 6 from contacting each other.

The description up to now has been given on the assumption that the pressure in the space 4 between the first separation film 1 and the second separation film 2 is equal to atmospheric pressure because the space 4 is connected to outside air. However, it is possible to maintain the difference between the pressure in the space 4 and the pressures of the first containing chamber 5 and the second containing chamber 6 even by forming a hermetically sealed space as a result of previously adjusting the pressure of a valve, which is provided for communication with the outside air, and then closing the valve.

When a hole is formed in one of the separation films and the second fluid is pushed out towards the sub tank 26, it is possible to detect any breakage in the separation film by detecting the movement of the second fluid.

Here, the welding lines 71 as the bridges 3 are described in more detail. In FIG. 4B, the welding lines 74 are independent lines and do not intersect each other. Due to the above-described structure, a closed space is not formed between the first separation film 1 and the second separation film 2. When the entire surface of the first separation film 1 and the entire surface of the second separation film 2 are in close contact with each other, or the welding lines form a closed space, even if the first separation film 1 or the second separation film 2 breaks, a passage that supplies air that forms the air bubbles 74 shown in FIG. 8 from the outside is blocked. Therefore, the bridges 3 are discretely disposed such that even if various locations in the first separation film 1 and the second separation film 2 in the fluid containing member 13 break, paths for supplying outside air to the broken locations remain.

In particular, when the first separation film 1 and the second separation film 2 are in close contact each other, the separation films that are in close contact with each other have a rigidity that is equivalent to that of a thin film having a thickness equal to those of two films together. The force required to deform the thin film is approximately 10 times that required when two separation films move together and are deformed. Therefore, the thin film may no longer be able to respond to very small pressure differences.

Up to now, the case in which the space, which is a gap between the first separation film 1 and the second separation film 2, communicates with outside air via the vent hole 18 is described. However, the space between the first separation film 1 and the second separation film 2 need not be filled with air. As shown in FIG. 3, the case in which the internal pressure of the first containing chamber 5 and the internal pressure of the second containing chamber 6 are equal to each other, and these internal pressures are set to negative pressures with respect to outside pressure by a few kPa is described. In this state, when one of the separation films breaks, in order to keep the first fluid and the second fluid out of contact with each other, the fluid that fills the space 4 need not be air. In addition, the pressure of the space 4 need not be equal to the outside pressure. That is, the vent hole 18 need not communicate with the outside air.

Figure 9:
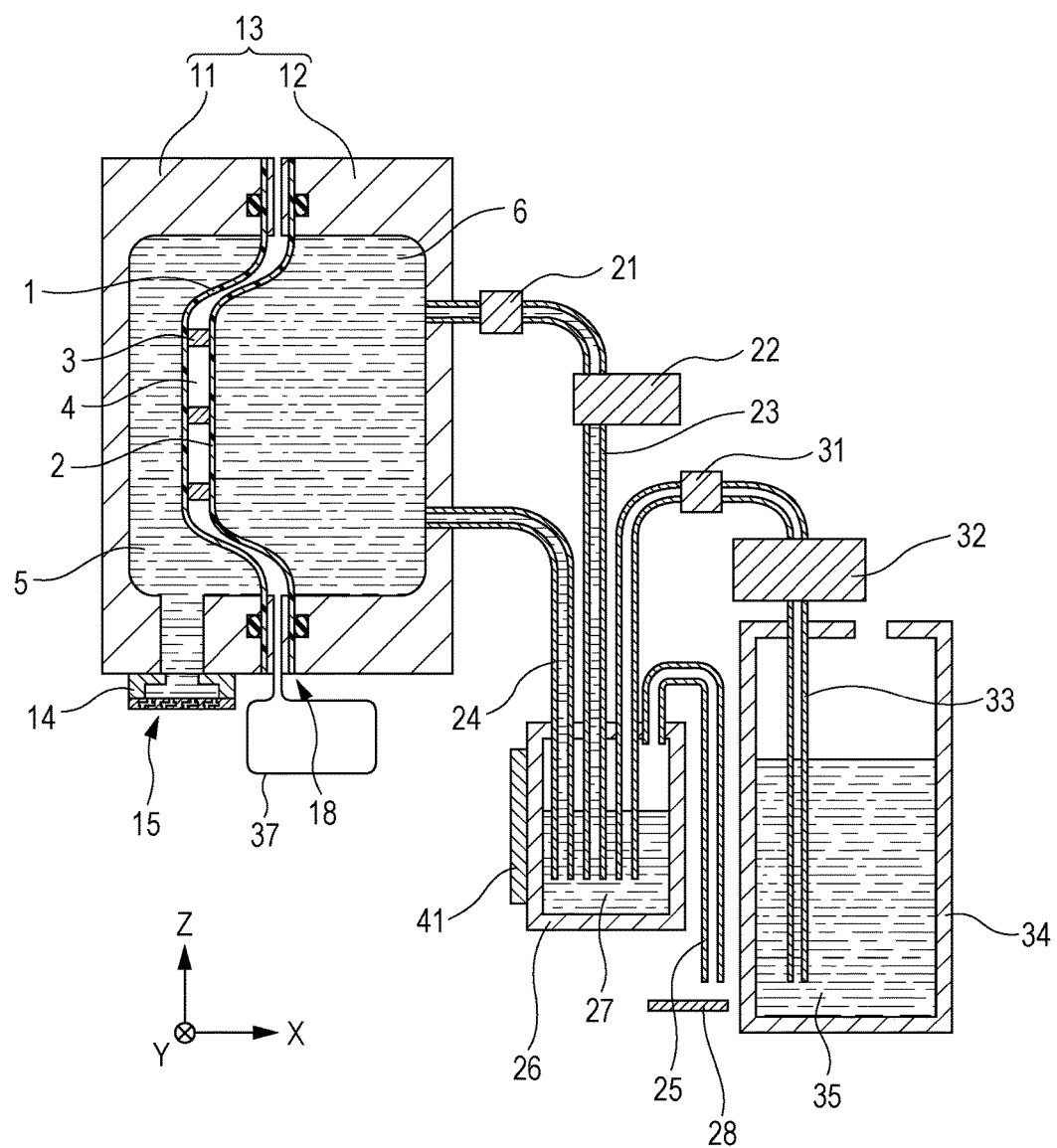
FIG. 9 shows a fluid containing member.
Figure 10:
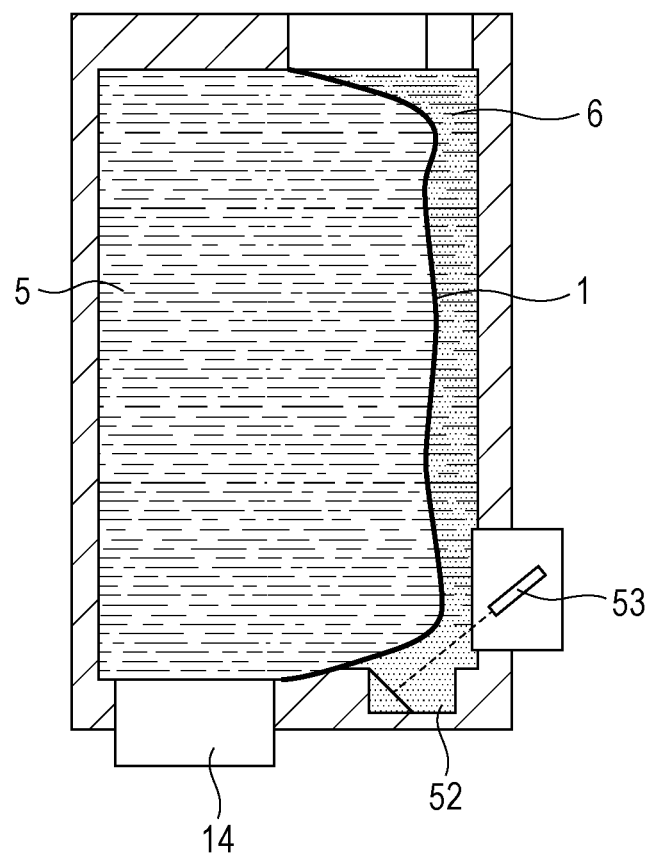
FIG. 10 shows an existing fluid containing member.

FIG. 9 shows a fluid containing member 13 in which a vent hole 18 communicates with a gas tank 37 in a hermetically sealed state. The gas tank 37 has, for example, a pressure of 110 kPa, which is greater than or equal to outside pressure. A chemically clean nitrogen gas is sealed in the gas tank 37. According to such a structure, for example, a first fluid is a photosensitive resist, and, even if a first separation film 1 breaks, it is possible to suppress changes in the photosensitive performance of the photosensitive resist caused by contact of oxygen with the first fluid. Since the chemically clean nitrogen gas does not contain metal ions, even if even if it contacts the first fluid, the first fluid is not contaminated by the metal ions. Further, since the internal pressure of the nitrogen gas is higher than the internal pressure of the first containing chamber 5, when a separation film breaks, the flowing of the nitrogen gas into the side of the first containing chamber 5 occurs earlier than the flowing out of the first fluid to a side of the space 4. By raising the pressure of the first containing chamber 5 and the pressure of the second containing chamber 6, it is possible to detect any breakage of the separation film.

Up to now, the description about the structure in which the first separation film 1 and the second separation film 2 are partly connected to each other or partly contact each other by the bridges 3 is given. Instead of contacting the first separation film 1 and the second separation film 2 by the bridges 3, the first separation film 1 and the second separation film 2 may contact each other by reducing the pressure of the space 4 between the first separation film 1 and the second separation film 2, for example, by making their pressure lower than outside pressure (atmospheric pressure). More specifically, it is possible to hermetically seal the space 4, provide a pressure control unit for controlling the pressure of the space 4 to a predetermined pressure, adjust the pressure of the space 4 by the pressure control unit, and contact the first separation film 1 and the second separation film 2 to each other. According to this method, due to, for example, creases that occur when the first separation film 2 and the second separation film 2 contact each other or creases that the first separation film 1 and the second separation film originally have, it is possible to partly contact the first separation film 1 and the second separation film 2 without contacting their entire surfaces. As a result, similarly to what has been described up to now, the first separation film 1 and the second separation film 2 can move together in accordance with changes in the internal pressure of the first containing chamber 5 or the second containing chamber 6. Compared to the method of contacting the first separation film 1 and the second separation film 2 due to thermal welding (the first separation film 1 and the second separation film 2 are thermally welded together), this method makes it possible to suppress hardening and breakage of a separation film. Compared to when the first separation film and the second separation film contact each other or are connected to each other by the bridges 3 (in particular, when the bridges 3 are a double-sided tape), it is possible to suppress an increase in the rigidity of the separation films. In order to realize an ideal contact state, it is desirable that the pressure of the space 4 between the first separation film 1 and the second separation film 2 be less than the outside pressure in a range that is greater than or equal to 0.4 kPa and less than or equal to 5.0 kPa. It is more desirable that the pressure of the space 4 between the first separation film 1 and the second separation film 2 be less than the outside pressure in a range that is greater than or equal to 0.5 kPa and less than or equal to 3.0 kPa.

Although the first separation film 1 and the second separation film 2 may basically be formed so as to move together by partly being connected to each other or by partly contacting each other, more desirable ranges are described. The more desirable ranges differ depending upon whether they are connected to each other or contact each other.

First, the case in which the first separation film 1 and the second separation film 2 are partly connected to each other is described. It is desirable that they be connected at a plurality of locations. In order to prevent a large gap from being formed between the first separation film 1 and the second separation film 2 when they move together, it is desirable that the plurality of connection locations be discretely disposed to the extent possible. Therefore, it is desirable that, in a plane in which the first separation film 1 and the second separation film 2 oppose each other, the plurality of connection locations be disposed at least near the center of gravity of the plane (at locations closer to the center of gravity than to the outer periphery) and near the outer periphery (at locations closer to the outer periphery than to the center of gravity). When the first separation film 1 and the second separation film 2 are to be partly connected to each other, as the area of the connection locations is reduced, the rigidity of the separation films as a whole can be reduced, and changes in pressure when the first separation film 1 and the second separation film 2 move together can be suppressed. Therefore, in the plane in which the first separation film 1 and the second separation film 2 oppose each other, the total area of the plurality of connection locations is desirably less than or equal to 40% of the area of the entire plane, more desirably less than or equal to 10% of the area of the entire plane, and even more desirably less than or equal to 5% of the area of the entire plane. On the other hand, when the area of the connection locations is too small, connection force (adhesion force) of the separation films at the connection locations is small, as a result of which the separation films tend to peel off from each other. Therefore, it is desirable that, in the plane in which the first separation film 1 and the second separation film 2 oppose each other, the total area of the connection locations be greater than or equal to 1% of the area of the entire plane.

Next, the case in which the first separation film 1 and the second separation film 2 partly contact each other is described. When the first separation film 1 and the second separation film 2 are made to contact each other by reducing the pressure of the space 4 between the first separation film 1 and the second separation film 2, the area of contact locations is comparatively large. When the first separation film 1 and the second separation film 2 contact each other, as the area of the contact locations is reduced, the separation films have difficulty moving together. Therefore, in the plane in which the first separation film 1 and the second separation film 2 oppose each other, the total area of the contact portions is desirably greater than or equal to 80% of the area of the entire plane, and more desirably greater than or equal to 90% of the area of the entire plane. Although they only contact each other, if the entire opposing surfaces contact each other and the rigidity of the separation films as a whole becomes too high, this state is close to a state when the thickness of only one separation film is only increased. Therefore, it is desirable that the difference between the pressure of the space 4 and outside pressure (atmospheric pressure) be less than or equal to 10 kPa, and the degree of contact be adjusted.

It is possible to discharge the first fluid from the discharge head 14. Therefore, the first fluid may be, for example, ink that is used in an ink jet printer.

The second fluid is a fluid for adjusting the pressure of the first fluid. Therefore, the second fluid need not be expensive ink. The second fluid may be, for example, water that generally has a specific gravity that is close to that of ink. However, it is desirable to, for the purpose of suppressing the spoiling of water and suppressing the growth of bacteria, use water to which an additive, which provides a preservative effect, is added.

Although it is desirable that the first fluid and the second fluid be a liquid, they may be a viscous fluid (or a resist material). In particular, since the second fluid adjusts the pressure of the first fluid, the second fluid may be a gas.

In the fluid containing member, it is more effective that the first fluid that is contained in the first containing chamber 5 be an imprint material. The reason is as follows. In a manufacturing process of, for example, a semiconductor device, a so-called imprint technique in which a mold having a pattern is brought into contact with the imprint material on a substrate, and the shape of the mold is transferred to the imprint material to form a pattern is available. The imprint material is contained in the first containing chamber 5 as the first fluid. Since the imprint material is used in forming very fine molded objects, the imprint material is not allowed to mix with the second fluid. Depending upon the composition of the second fluid, contact by only a slight amount changes the composition of the first fluid (the imprint material). For example, the entry of only a small number of metal ions in the second fluid into the first fluid causes the first fluid to be contaminated by the metal ions, and makes it difficult to use as an imprint material. In addition, the entry of only a small amount of foreign substance into the first fluid influences the formation of the pattern. Therefore, when the fluid containing member that is capable of suppressing mixture of the first fluid and the second fluid is used as an imprint material containing member, the effect thereof is very large. When the first fluid is an imprint material, the fluid containing member can be used as a member (a cartridge) that is mounted on an imprint apparatus.

Even if, instead of a mold having a pattern, a flat mold (flattening member) is pressed on the substrate, the fluid containing member is effectively used. In this case, this is because, although the first fluid is, for example, a resist, the composition of the resist on the substrate is as important as the composition of the imprint material above.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-138190 filed Jul. 14, 2017, and Japanese Patent Application No. 2018-094398 filed May 16, 2018, which are hereby incorporated by reference herein in their entirety.

What is claimed is:

1. A fluid containing member comprising:
a first containing chamber that contains a first fluid; and
a second containing chamber that contains a second fluid,
wherein the first containing chamber and the second containing chamber are separated from each other by a first separation film on a side of the first containing chamber and a second separation film on a side of the second containing chamber, and
wherein the first separation film and the second separation film are partly connected to each other or partly contact each other so as to move together in accordance with a change in an internal pressure of the first containing chamber or an internal pressure of the second containing chamber, and
wherein a space, which is a gap, is provided between the first separation film and the second separation film, and communicates with outside air.

2. The fluid containing member according to claim 1, wherein the first fluid is a fluid that is discharged from a discharge head.

3. The fluid containing member according to claim 1, further comprising a discharge head that communicates with the first containing chamber and that is configured to discharge the first fluid.

4. The fluid containing member according to claim 1, further comprising a pressure adjusting unit that communicates with the second containing chamber and that is configured to adjust a pressure of the second fluid.

5. The fluid containing member according to claim 1, wherein the first containing chamber comprises a recessed portion of a casing closed by the first separation film, and the second containing chamber comprises a recessed portion of a casing closed by the second separation film.

6. The fluid containing member according to claim 1, wherein at least one of the first separation film and the second separation film has a protruding shape.

7. The fluid containing member according to claim 6, wherein the protruding shape includes a ceiling portion, a side surface portion, and an R portion that is disposed between the ceiling portion and the side surface portion, and
wherein the ceiling portion is thicker than the side surface portion and the R portion.

8. The fluid containing member according to claim 1, wherein the first separation film is thicker than the second separation film.

9. The fluid containing member according to claim 1, wherein the internal pressure of the first containing chamber is lower than outside pressure.

10. The fluid containing member according to claim 1, wherein the first separation film and the second separation film are connected to each other or contact each other at a plurality of locations.

11. The fluid containing member according to claim 1, wherein the first separation film and the second separation film are thermally welded together.

12. The fluid containing member according to claim 1, wherein the first separation film and the second separation film each have a protruding shape including a ceiling portion, a side surface portion, and an R portion that is disposed between the ceiling portion and the side surface portion, and
wherein an arrangement density of bridges that connect the first separation film and the second separation film to each other is higher at the ceiling portion than at the side surface portion and the R portion.

13. The fluid containing member according to claim 1, wherein the first separation film and the second separation film are connected to each other by a linear bridge.

14. The fluid containing member according to claim 13, wherein, in an orientation of the fluid containing member that is being used, the linear bridge extends along a direction orthogonal to a gravitational direction.

15. The fluid containing member according to claim 1, wherein the first separation film and the second separation film are connected to each other by a different member that differs from the first separation film and the second separation film.

16. The fluid containing member according to claim 1, wherein a space, which is a gap, is provided between the first separation film and the second separation film, and the first separation film and the second separation film partly contact each other by reducing a pressure of the space.

17. The fluid containing member according to claim 1, wherein the second fluid is a liquid.

18. The fluid containing member according to claim 1, wherein the first fluid is an imprint material.

19. A fluid containing member comprising:
a first containing chamber that contains a first fluid; and
a second containing chamber that contains a second fluid,
wherein the first containing chamber and the second containing chamber are separated from each other by a first separation film on a side of the first containing chamber and a second separation film on a side of the second containing chamber, and
wherein the first separation film and the second separation film are partly connected to each other or partly contact each other so as to move together in accordance with a change in an internal pressure of the first containing chamber or an internal pressure of the second containing chamber, and
wherein the first separation film and the second separation film are connected to each other or contact each other at a plurality of locations.

20. A fluid containing member comprising:
a first containing chamber that contains a first fluid; and
a second containing chamber that contains a second fluid,
wherein the first containing chamber and the second containing chamber are separated from each other by a first separation film on a side of the first containing chamber and a second separation film on a side of the second containing chamber, and
wherein the first separation film and the second separation film are partly connected to each other or partly contact each other so as to move together in accordance with a change in an internal pressure of the first containing chamber or an internal pressure of the second containing chamber, and
wherein the second fluid is a liquid.

* * * * *